United States Patent

Takeda et al.

[19]

[11] Patent Number: 4,778,560
[45] Date of Patent: Oct. 18, 1988

[54] METHOD FOR PRODUCTION OF THIN FILM TRANSISTOR ARRAY SUBSTRATES

[75] Inventors: Etsuya Takeda, Suita; Takao Kawaguchi, Hirakata; Yutaka Nanno, Neyagawa; Noriko Okawa, Osaka; Seiichi Nagata, Sakai, all of Japan

[73] Assignee: Matsushita Electric Industrial Co., Ltd., Kadoma, Japan

[21] Appl. No.: 56,989

[22] Filed: Jun. 3, 1987

[30] Foreign Application Priority Data

Jun. 3, 1986 [JP] Japan .................. 61-128667

[51] Int. Cl.4 .................. H01L 21/306; B44C 1/22; C03C 15/00; C23F 1/02
[52] U.S. Cl. .................. 156/643; 156/653; 156/656; 156/657; 156/659.1; 156/661.1; 156/662; 156/667; 350/332; 357/4; 357/23.7; 437/58; 437/181; 437/228
[58] Field of Search .................. 156/643, 646, 649, 653, 656, 657, 659.1, 661.1, 662, 667; 357/2, 4, 23.1, 23.7; 437/51, 58, 228, 181; 350/330, 332, 333, 336

[56] References Cited

U.S. PATENT DOCUMENTS

| 4,514,253 | 4/1985 | Minezaki | 156/659.1 |
| 4,624,737 | 11/1986 | Shimbo | 156/643 |
| 4,654,117 | 3/1987 | Aoki et al. | 156/659.1 |

FOREIGN PATENT DOCUMENTS 60-95481  5/1985  Japan .

*Primary Examiner*—William A. Powell
*Attorney, Agent, or Firm*—Wenderoth, Lind & Ponack

[57] ABSTRACT

A method of production of active matrix display substrates using thin film transistors and more particularly to a method for production of substrates for liquid-crystal display use. The active matrix substrate using the thin film transistor is produced by the mask processes of smaller number. The process of the present invention can reduce the number of the masks, by one, of the active matrix substrate using the inverted staggered thin film transistor which requires the masks from five levels to six levels. Further improvements reduce the number of the masks to four levels from three levels, thus contributing greatly towards lower cost, improved yield.

5 Claims, 10 Drawing Sheets

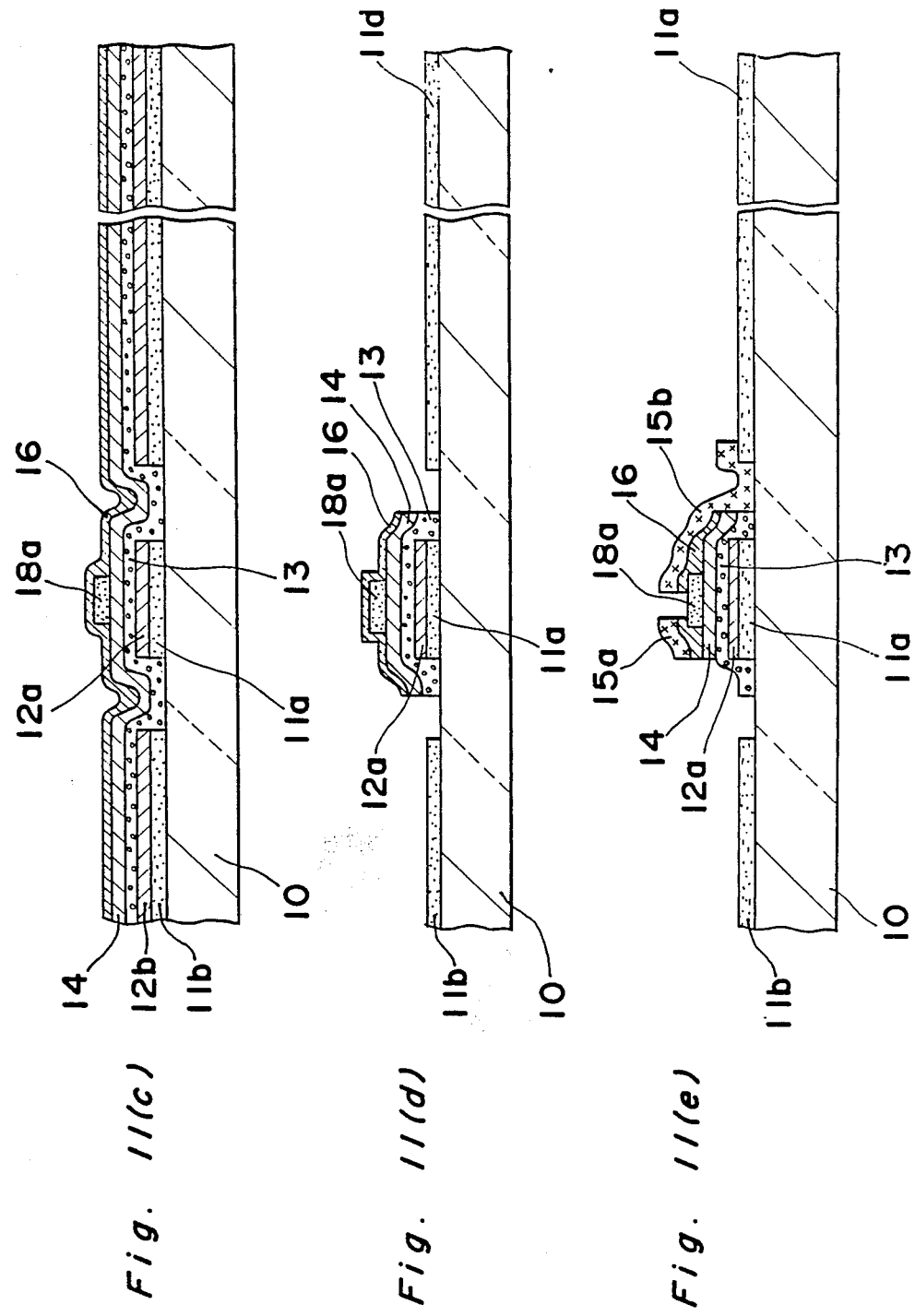

METHOD FOR PRODUCTION OF THIN FILM TRANSISTOR ARRAY SUBSTRATES

BACKGROUND OF THE INVENTION

The present invention relates to a method for production of active matrix display substrates using thin film transistors (TFT) and more particularly to a method for production of substrates for liquid-crystal display use.

As the display using active matrix type display substrates using thin film transistors provide picture quality higher than the simple matrix type display apparatus does, it is actively studied. The active matrix type display apparatus is shown in construction in FIG. 1. It is composed of a source (or drain) electrode bus 21 and a gate electrode bus 22 formed on a light transmission base plate 20, a thin film transistor 23, a display substrate 25 supporting a picture-element electrode 24, an opposite substrate 27 having an opposite electrode 26 with the liquid crystal being sealed in between the substrates 25 and 27. The active matrix type display substrate using such thin film transistors have more processes than the simple matrix type display apparatus has, thus resulting in higher price. A method of decreasing the processes is proposed. A method of reducing the mask operations into two levels is disclosed in, for example, Japanese Patent Application Laid-Open publication (Tokkaisho) No. 59-501562. The thin film transistor of this method is a staggered type of forming the insulator on the semiconductor, thus making it difficult to provide the thin film transistor of good quality.

On the other hand, the inverted staggered thin film transistor for forming the semiconductor on the insulator provides the thin film transistors of good quality, but requires five levels of mask operation for the production of the matrix display substrates. This method will be described with reference to FIG. 2. The thin film transistor is composed of a Cr gate 31 piled up on the insulating substrate 30, a SiNx insulating layer 32, an a Si (amorphous silicon) layer 34, an Al source 35, an Al drain 36. The picture element electrode 38 is made of the ITO (Indium-Tin-Oxide) which is a transparent conductive layer. The thin film transistor and the picture-element electrode 38 are combined with the drain 36 connected with the contact hole 42 formed in the insulation layer 32. The formation of this construction requires the following pattern forming process.

(1) The ITO is selectively etched to form the picture-element electrode.
(2) The gate metal is selectively etched to form the gate-electrode bus 31.
(3) The insulation layer 32 is formed to have a window portion 42 in the insulation layer 32 (a gate electrode bus take-out portion of the peripheral portion is also formed).
(4) The a Si semiconductor is formed and is selectively etched to provide the a Si layer 34 of the island-shaped pattern.
(5) The source drain metal is selectively etched to form the drain 36 connected with the picture-element electrode 38 through the source electrode bus 35 and the contact hole 42.

This method requires five photomasks. The above described producing method does not form the n+- a Si layer doped for setting up an ohmic relation between the source drain electrodes 35, 36 and the α- Si semiconductor layer 34. In order to provide a process of piling up this n+- a Si layer, a process is required of forming a channel protective layer in advance (between the (2) and the (3) of the above-described pattern process) on the a Si layer so that the n+- a Si layer is removed in the pattern of the source drain and the a Si 34 of the semiconductor layer is not etched. In this case, six masks are required.

In order to provide the active matrix display substrate using the inverted, staggered good-quality TFT which piles up the semiconductor layer after the insulating layer has been piled up as described hereinabove, five or six masks are required and many processes are provided.

SUMMARY OF THE INVENTION

Accordingly, an object of the present invention is to make it possible to produce with the mask processes of smaller number the active matrix substrate using the TFT.

The present invention relates to a method for production of active matrix type display substrates including, as components, the thin film transistor and the picture-element electrode for display use in each of the picture elements, a method for production of the display substrates, wherein the gate electrode bus is composed of the transparent conductive layer constructing the picture-element electrode and the multi-layer film with at least one portion of the transparent conductive layer being laminated by the other conductive layer. The gate electrode and the picture-element electrode for display may be simultaneously formed by the production method of the present invention, which comprises the step of performing the pattern formation by one level of mask operation after the multi-layer films of the transparent conductive layer and the other conductive layer have been piled up. The transparent picture element may be provided by the production method of the present invention, which removes at least one portion of the metal on the picture-element electrode for display use by the other mask after the above-described pattern formation.

In a process of etching the transparent conductive layer shown in the conventional art to form the picture-element electrode 38, a process of etching the gate metal to form the gate electrode bus 31, the pattern formation is performed by the same mask to reduce the number of the masks in accordance with the present invention. Namely, the transparent conductive layer electrode and the gate metal which construct the conventional picture-element electrode are laminated to etch the gate metal and the transparent conductive layer. Furthermore, in order to make the picture-element electrode transparent, the metal on the transparent conductive layer may be etched by the process using the other mask.

BRIEF DESCRIPTION OF THE DRAWINGS

These and other objects and features of the present invention will become apparent from the following description taken in conjunction with the preferred embodiment thereof with reference to the accompanying drawings, in which;

FIG. 10 and FIGS. 11(a)-11(e) are a plan view and sectional views for illustrating the processes in the embodiment 3 of the present invention.

DETAILED DESCRIPTION OF THE INVENTION

Figure 1:
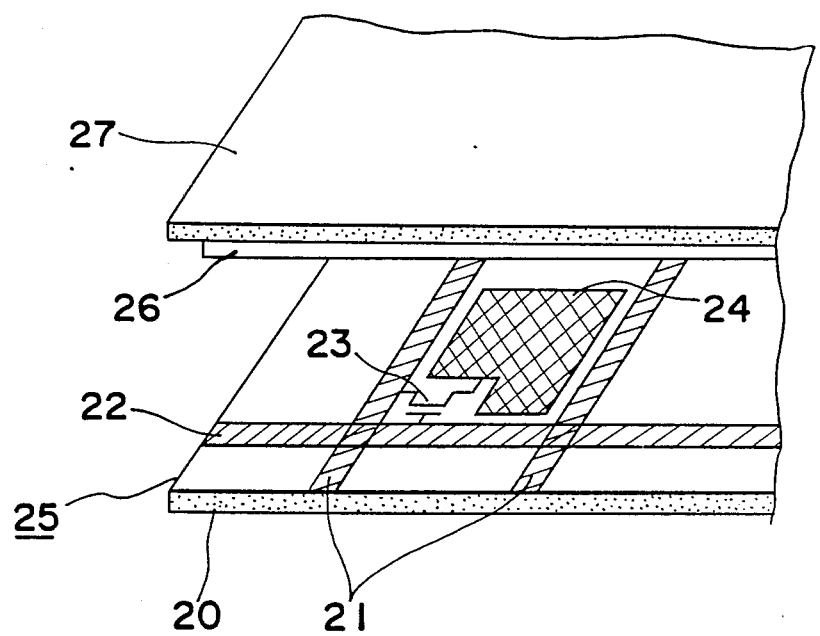
FIG. 1 is an exploded view of a display apparatus using the thin film transistor.
Figure 2A:
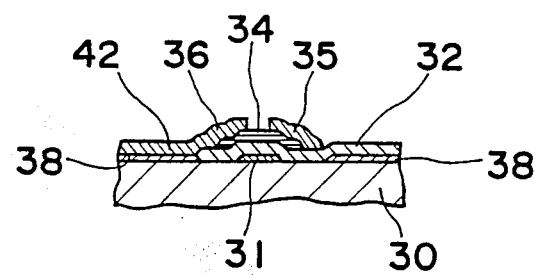
FIGS. 2(a) and 2(b) show views for illustrating the conventional processes using the inverted staggered type thin film transistor.
Figure 2B:
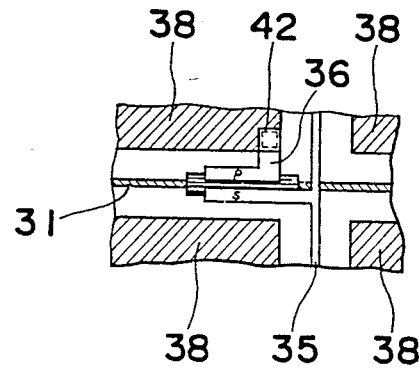

Before the description of the present invention proceeds, it is to be noted that like parts are designated by like reference numerals throughout the accompanying drawings.

(Embodiment 1)

Referring now to the drawings, FIG. 3 shows a plan view for illustrating the process, FIG. 4 shows a sectional view.

(1) ITO which is a transparent conductive layer is piled up by 1000 A, Cr metallic layer is piled up by 1000 A in a DC sputtering method on a glass base plate 10.

Figure 3A:
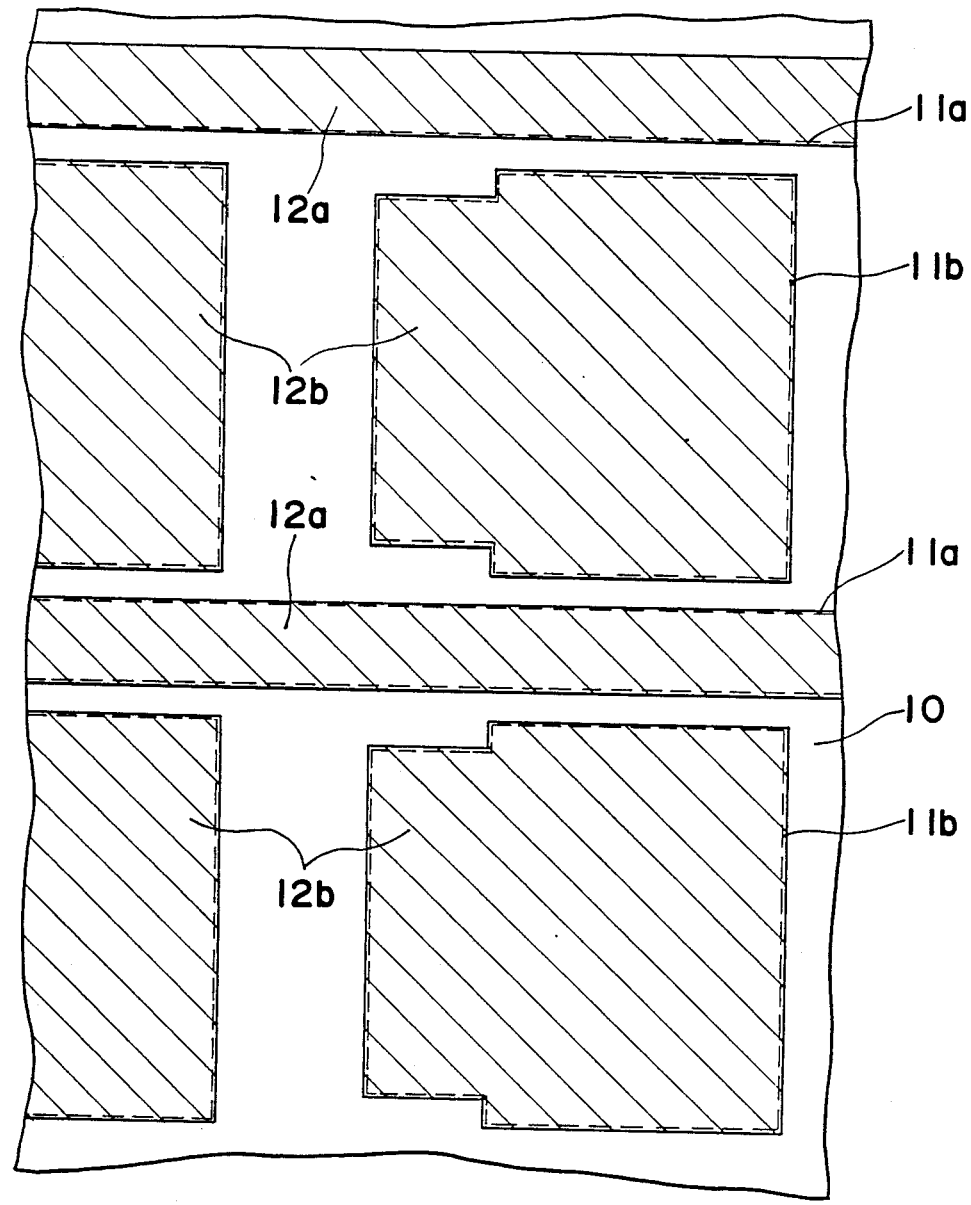
FIGS. 3(a)-3(c) show plan views for illustrating the production processes of the thin-film-transistor array substrate in the embodiment 1 of the present invention.

(2) An etching operation is effected so that the ITO, Cr may remain in the form of a gate electrode composed of ITO 11a, Cr 12a, a picture element electrode composed of ITO 11b, Cr 12b through selective, simultaneous etching operation after the photolitho process using a photomask. In FIG. 3a, the pattern of the Cr electrodes 12a, 12b is formed with the ITO 11a, 11b being formed as shown in broken lines under the pattern. It is to be noted that the ITO 11a, 11b are omitted in FIGS. 3b, and 3c.

(3) Then, an insulating layer 13 composed of the SiNx layer 2000 A is piled up in a plasma CVD method, the semiconductor layer 14 of the a Si (amorphous silicon) layer.

Figure 3B:
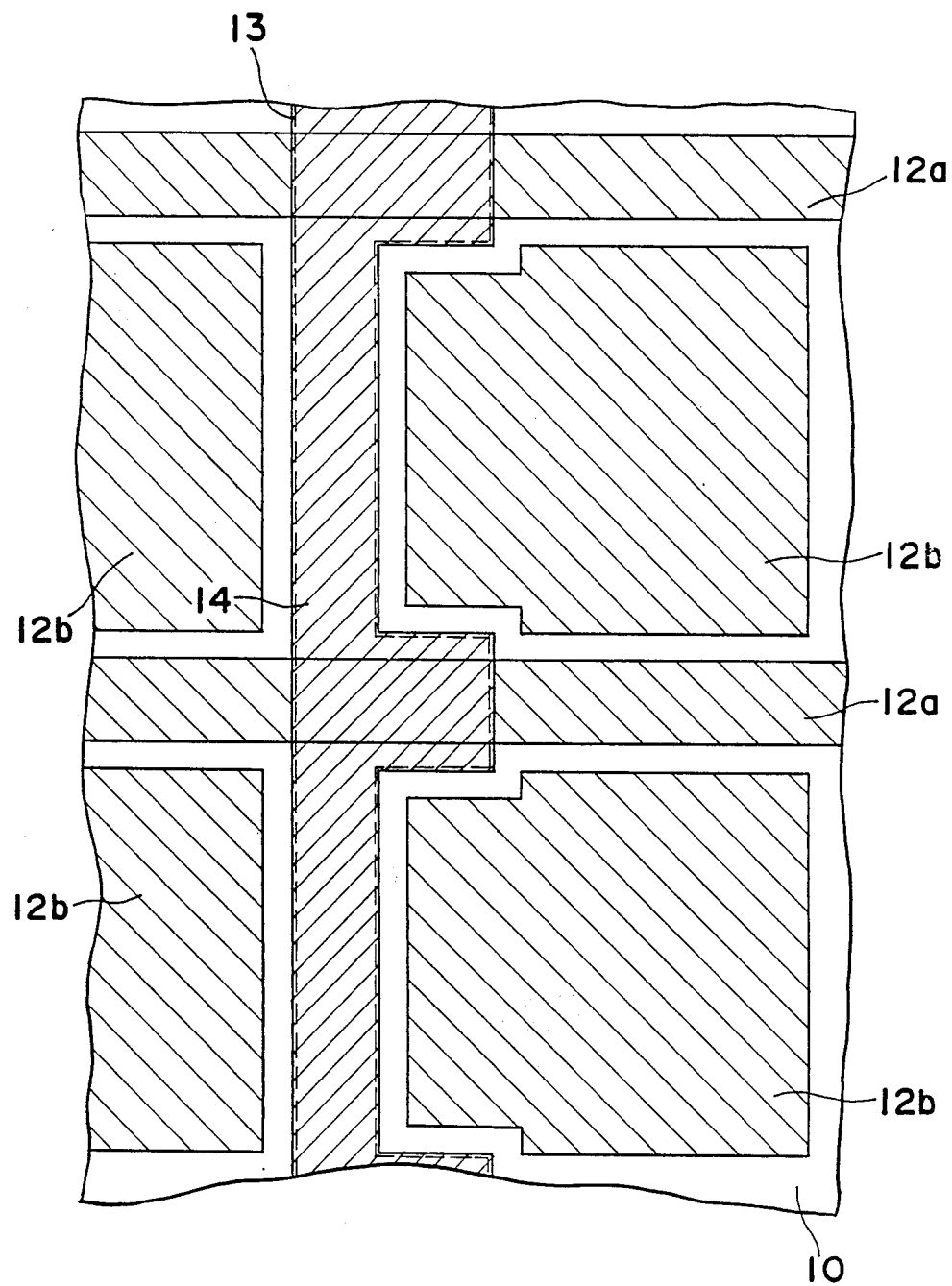

(4) The a Si island region composed of a gate insulating layer and a channel region is formed by the selective etching operation after the photolitho process using the photomask so that the layers 13, 14 may remain in the form of such a pattern shown in FIG. 3b. The broken line or the gate insulating layers 13, 14 are the a Si island region. The layer 13 is omitted in FIG. 3c.

(5) Then, the Al is piled up by 7000 A in the DC sputtering method.

Figure 3C:
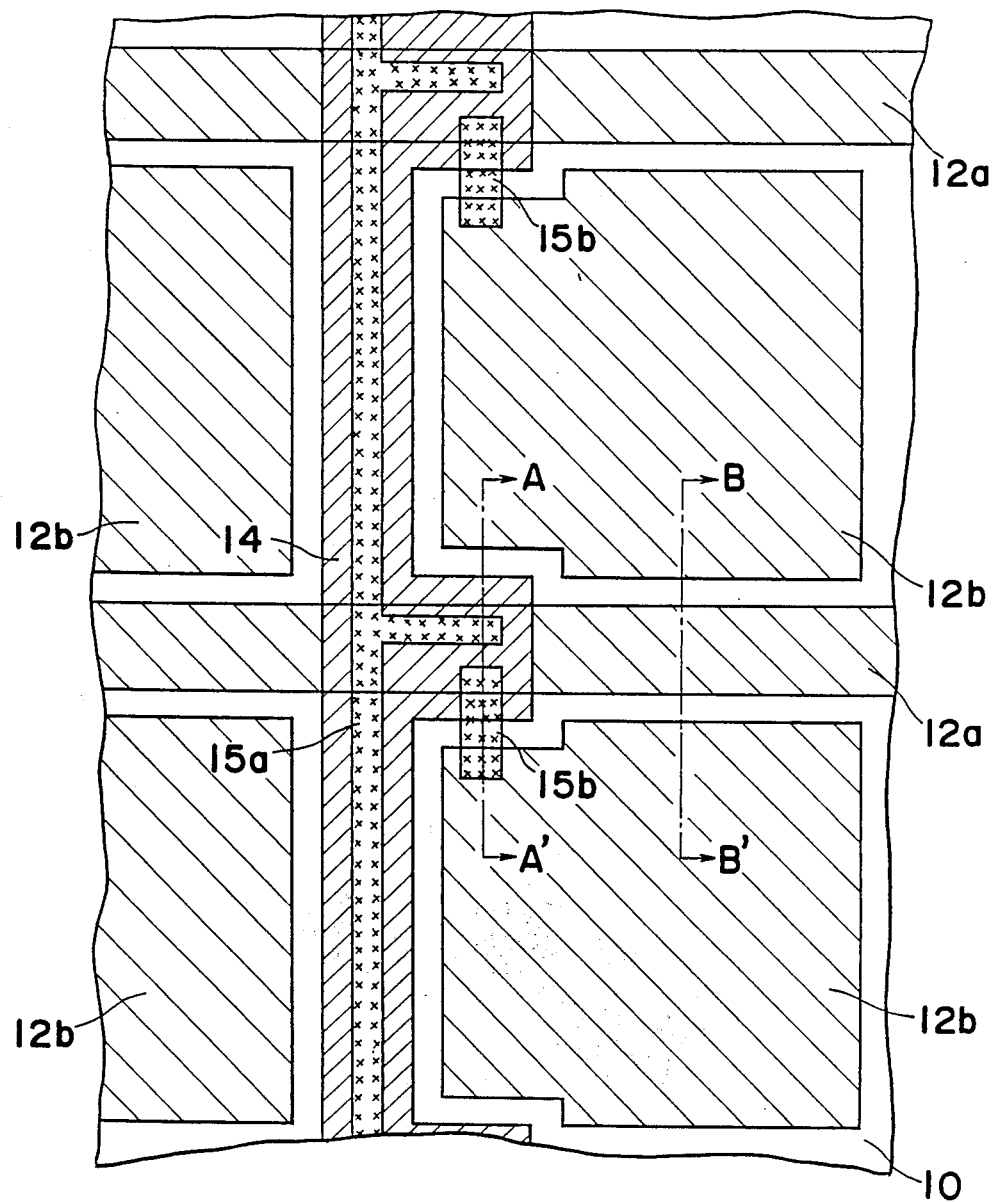
Figure 4A:
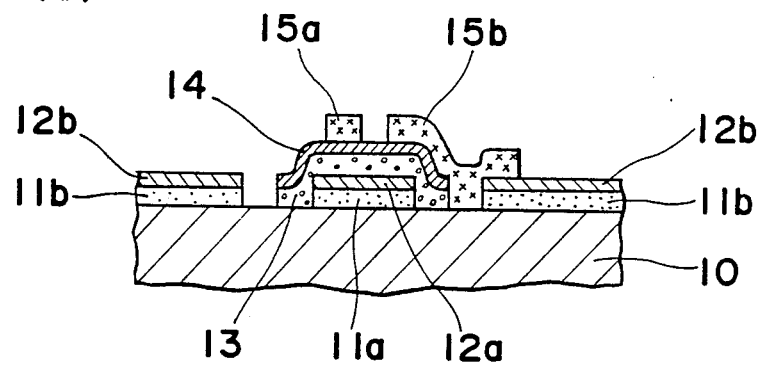
FIGS. 4(a) and 4(b) show the cross-sectional views taken along a line A—A', a line B—B' of FIG. 3(c)
Figure 4B:
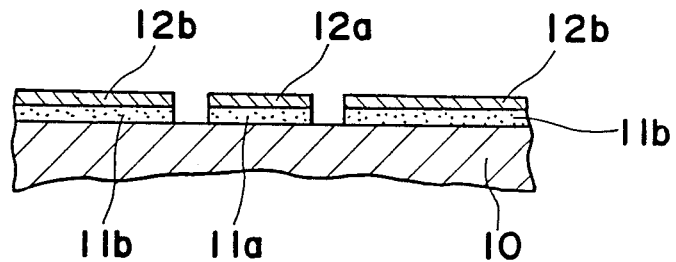
Figure 5:
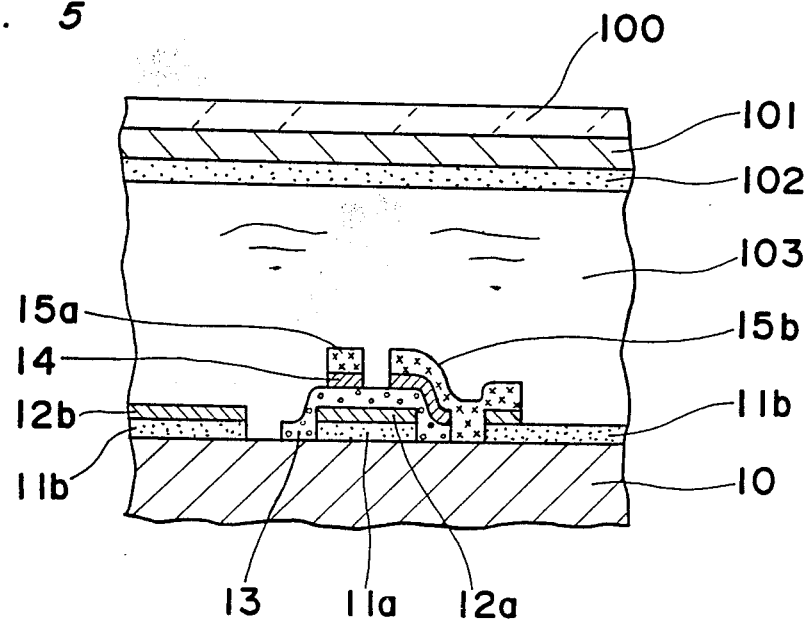
FIG. 5 is a partial sectional view of the liquid-crystal display apparatus using the array substrate of the present invention.

(6) The Al is selectively etched by the photolitho process using the third mask so that the Al may remain in the source (or drain) electrode 15a of such a pattern as shown in FIG. 3c, in the drain (or source) electrode 15b. FIGS. 4a, and 4b shown the sectional views of the A—A', B—B' line portions of FIG. 3c of the finished active matrix base plate. Though not shown in FIG. 3c, the ITO 11a, 11b are formed in the same pattern under 12a, 12b the gate insulating layer 13 is formed in the same pattern under the a Si 14.

In the present embodiment as described hereinabove, an active matrix base plate of thin-membrane transistor construction of a reverse stagger type is composed of three masks. As the portion of the picture-element electrode 12b remains as the picture-element electrode, it may be used for liquid-crystal display or the like of a reflection type. In order to provide a liquid-crystal display apparatus, the matrix base plate formed in this mannner is placed opposite to the other glass base plate 100 (in the case of the color, the color filter 101 is formed) with the liquid crystal 103 being sealed in between them. Reference numeral 102 is a transparent electrode.

(Embodiment 2)

Figure 6B:
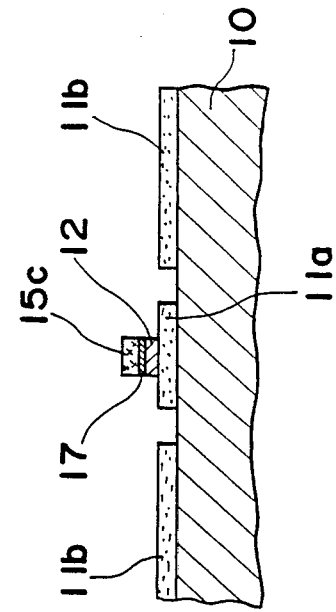
FIGS. 6(a) and 6(b) and FIG. 7 are plan views and a sectional view for illustrating the process in the embodiment 2 of the present invention.
Figure 6A:
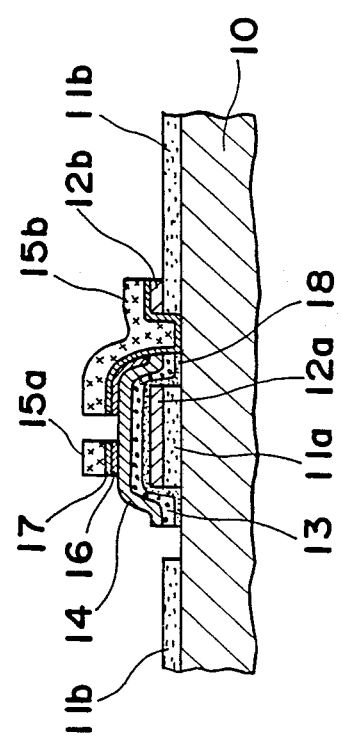
Figure 7:
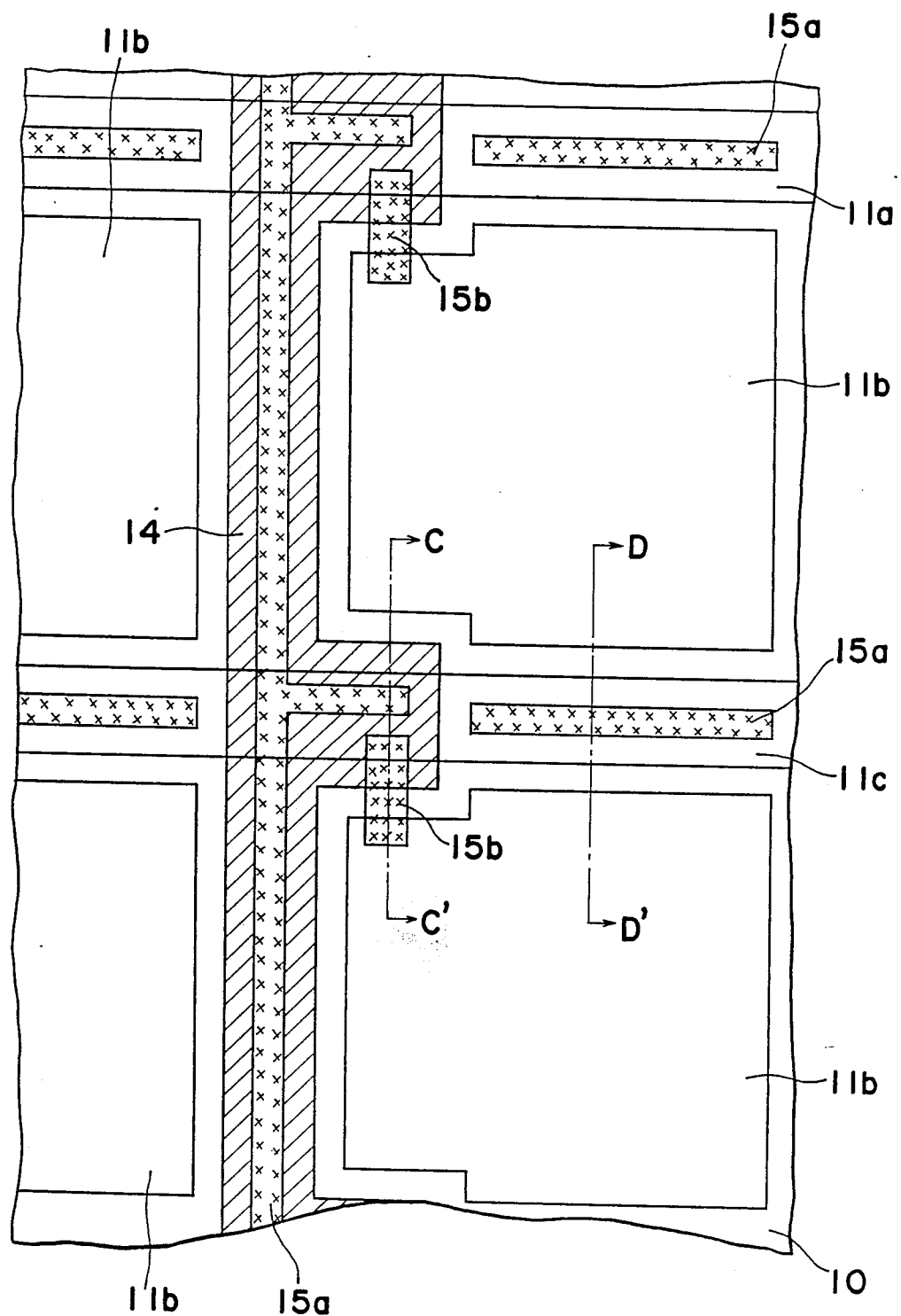

The present embodiment is almost the same as the embodiment 1. The description of the common process is omitted. FIG. 7 is a plan view of a base plate formed in this process. FIGS. 6a, and 6b show the C—C', D—D' line sections of FIG. 7. (1) and (2) are the same as (1) and (2) in the embodiment 1.

(3) TaOX layer 18 is piled up by 2000 A in a reactive sputter method, SiNx layer 13 is piled up by 2000 A in a plasma CVD method, the a Si layer 14 is piled up by 200 A as the semiconductor, the n+ aSi layer 500 A 16 is piled up.

(4) The layers 13, 14, and 16 are chemically dry-etched by the use of F4 (0.2 Pa) and O2 (0.05 Pa) after the photolitho process through the second photomask as the layers may remain in the same form as that in FIG. 3b. The etching speed is 2700 A per minute in α Si, SiN is 2200 A per minute, TaOx is 1200 A per minute. The opening portion is taper-etched.

(5) MoSi$_2$ is piled up by 500 A, Al is piled up by 7000 A in the DC sputter method.

(6) The Al, MoSi$_2$ are selectively etched after the photolitho process by the third photomask, and are etched so that they may remain in the form of the source (or drain) electrode 15a of such a pattern as shown in FIG. 7, the drain (or source) electrode 15b, the gate backup metal 15. As the etching liquid is a HF:HNO$_3$ mixed liquid when the MoSi$_2$ 17 under the Al is etched, one portion of n+ a Si 16 and a Si layer of the exposed portion which is not covered by the pattern of the 15a, 15b, and 15c is etched. The Cr metal 12b on the gate electrode, the picture element electrode which are not covered by the 15a through 15c, 14a is etched, so that the transparent pattern 11a, 11b may be exposed as shown in FIG. 7, FIG. 6 and the picture element becomes an element through which the light is transmitted.

It is to be noted that in FIG. 7 showing the active matrix base plate finished like this, layer 16, metals 12a, 12b, SiNx layer 13, TaOx layer 18, MoSi 17 are omitted and not shown. In the present embodiment, the active matrix base plate may be formed with three masks. As the picture-element electrode is transparent, it may be used in transmission type liquid-crystal display or the like.

(Embodiment 3)

Figure 8:
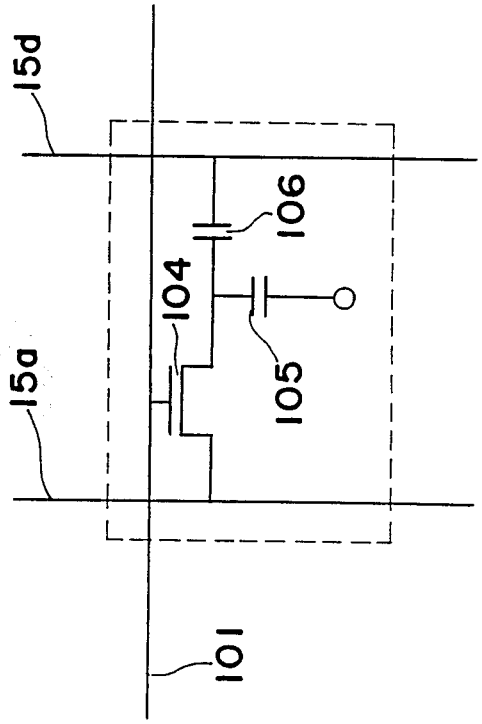

The present embodiment relates to a case where a channel protecting layer is provided. This is a method of realizing an active matrix base plate having the picture element unit (within the broken line) of such an equivalent circuit shown in FIG. 8, which comprises a gate electrode bus line 101, a source electrode bus line (or drain electrode bus line) 15a, a common electrode 15d, a transistor 104, the load capacitor 105 of the liquid crystal or the like, a storage capacitor 106 is connected with the common electrode. The process will be described by the use of the final plan view of FIG. 10, the process sectional view of FIG. 11. the X of FIG. 11 is a process of the E—E' line portion of FIG. 10, the Y thereof is a sectional process of the take-out portion of the gate electrode bus of the peripheral portion though the Y is not shown in FIG. 10. The steps (1), (2) of the embodiment 1 are common. The following steps are as follows.

(3) The SiNx layer 13 as an insulation layer is piled up by 4000 A, the a Si layer 14 as a semi-conductor layer is piled up by 500 A, the SiNx layer 18 is piled up by 1000 A in the plasma CVD method.

Figure 10:
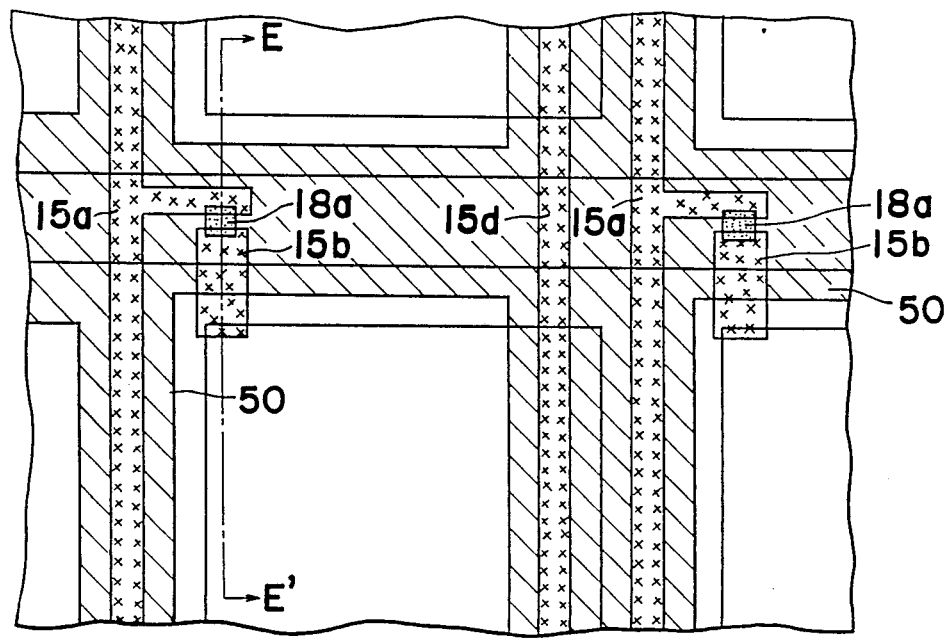
Figure 11A:
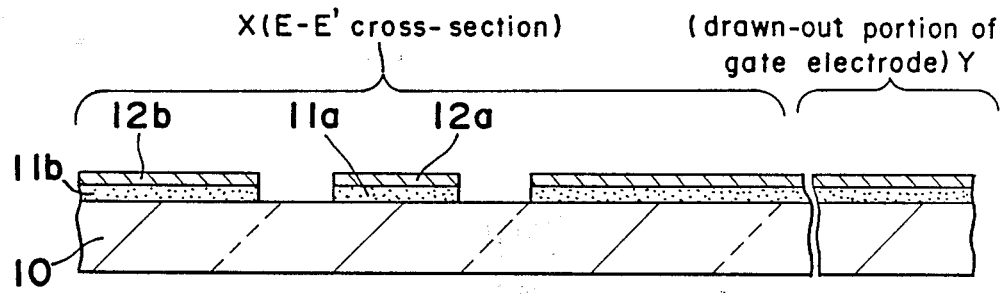
Figure 11B:
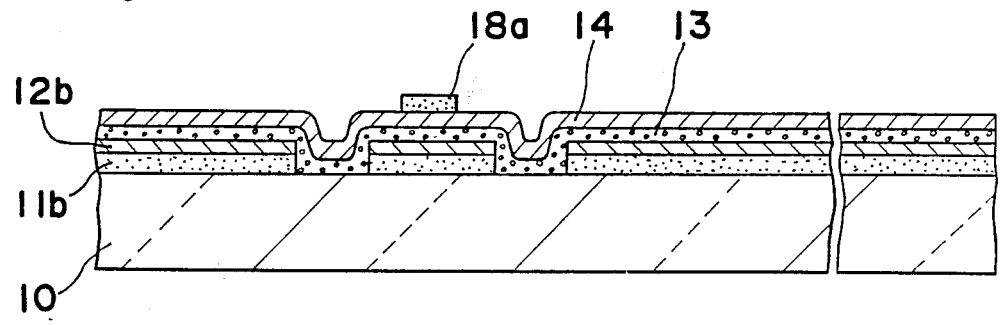

(4) The layer 18 which becomes a channel protection layer after the photolitho process using the second photomask is etched so as to remain in the shape of such a pattern 18a as shown in FIG. 10. (FIG. 11b).

(5) The impurity dope n+aSi layer 16 is piled up by 500 A in the plasma CVD method (FIG. 11c).

Figure 9:
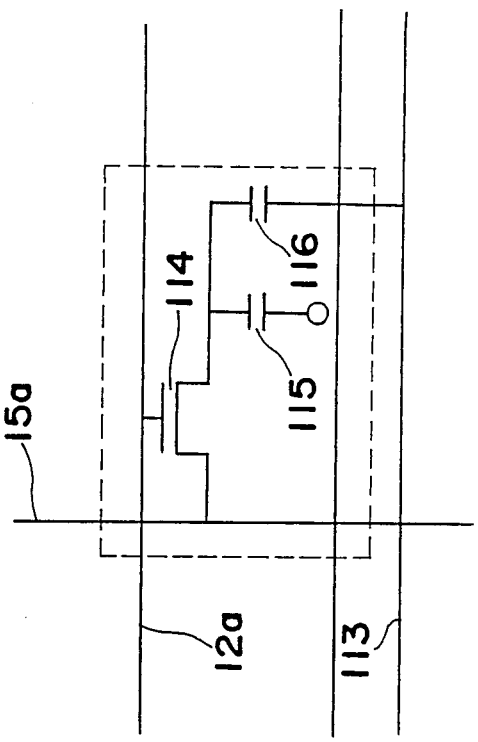
FIG. 8 and FIG. 9 are equivalent circuit diagrams in the embodiment 3 and the embodiment 4.

(6) The layers 16, 14, 13, and 12, after the photolitho process using the third photomask, are etched in the oblique-line-portion pattern 50 of FIG. 9, the gate electrode take-out portion is etched to expose the ITO 11 (FIG. 11d).

At this time, the ITO 11d is exposed to the take-out of the gate electrode.

(7) The MoSi$_2$, the Al 15 are piled up respectively by 500 A, 7000 A in the DC sputter method.

(8) After the photolitho process using the fourth photomask, the layers 15, and 17 are etched so as to remain in the patterns of the source (or drain) electrode 15a, the drain (or source) electrode 15b, the common electrode 15d of the pattern shown in FIG. 10. Furthermore, they are etched to remain in the pattern of the 15d. Furthermore, the exposed layers 16, and 14 which are not covered by 15a, 15b, 15d, and 18a are etched (FIG. 11e).

The active matrix substrate, shown in FIG. 10, finished in this manner may be completed with 11a, 12a, 13, 14, and 16 are omitted.

(Embodiment 4)

The present embodiment relates, also, to a case where a channel protecting layer is provided, and to a method of realizing an active matrix circuit having the picture-element (within the broken line) of the equivalent circuit seen in FIG. 9, which includes a gate line 111, a source line 112 (or a drain line), a gate line 113 of the front stage, a transistor 114, a load capacitor 115 of liquid crystal or the like, a storage capacitor 116 connected with the front stage gate line. The process of the active matrix circuit of realizing them is shown in the plan view of FIG. 12. In the present embodiment, the TFT may be realized with four masks.

(Embodiment 5)

Figure 12:
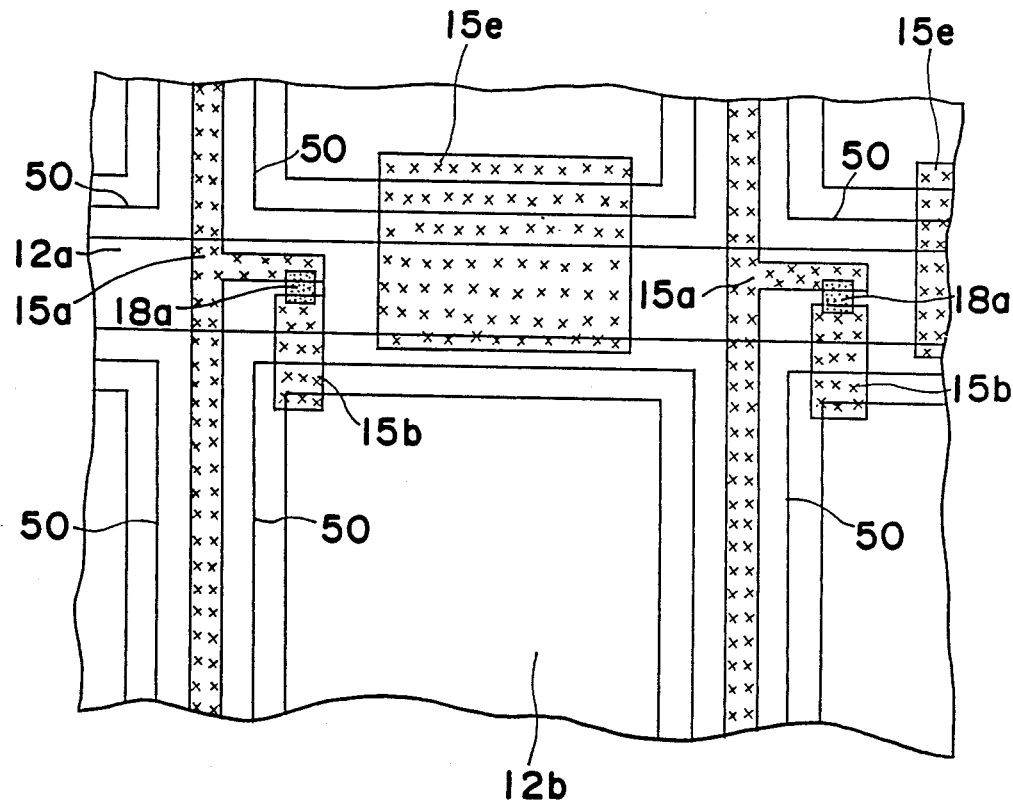
FIG. 12 is a plan view for illustrating the process in the embodiment 4 of the present invention.

In the embodiment 4, the pattern 50 of FIG. 12 is larger than the pattern 12b of the picture element electrode. The foundation glass substrate is exposed in the region between the pattern 50 and the pattern 12b. As the glass substrate of this region is etched by about 10000 A simultaneously with the etching operation of the a Si, the SiNX, inconveniences such as liquid-crystal uneven-orientation or the like. Accordingly, in the present embodiment, the SiO$_2$ is formed by 2000 A on the foundation glass substrate 10 in the normal-pressure CVD method. Finally the etching of the foundation glass substrate is 1000 A in depth.

(Embodiment 6)

In the present embodiment, the pattern 50 of FIG. 11 is smaller than the pattern 12b of the picture-element electrode as the other method of improving the inconveniences of the foundation glass substrate described in the embodiment 5. Thus, the foundation glass substrate is not exposed so that the etching operation is not performed.

In the above-described embodiment, there was shown a method of forming the gate wiring with Cr metal by which the gate electrode was formed on the ITO and on it. But SnO$_2$, CdO, ZnO or the like is provided as the transparent electrode in place of the ITO. A material which may endure the etching agent of the semiconductor layer and the insulating layer is required to be selected as the metal on the transparent electrode. There is Al, Cr, Mo, TiN, silicide or the like in place of Cr. The metal may be of a layer of two kinds or more, Al and MoSi$_2$, Al and TiN, etc. Also, SiNX, TaOx/SiNX are provided as the insulating layer oxide such as SiO$_2$, Ta$_2$O$_5$, Al$_2$O$_3$ or the like is desired for the protection of the transparent conductive layer as the insulating layer on the side of the connection with the gate. Also, the semiconductor layer is a Si, but may be CdSe, Te, poly Si or the like. Also, the etching may be either the wet etching or the dry etching (reaction ion etching, chemical dry etching).

The process of the present invention can reduce the number of the masks, by one, of the active matrix substrate using the inverted staggered TFT which required the masks from five levels to six levels. Further improvements reduce the number of the masks to four levels from three levels, thus contributing greatly towards lower cost, improved yield.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A method for production of a thin film transistor array substrate which includes as components a source bus line electrode for transmitting signals, a gate bus line electrode for transmitting signals, a thin film transistor formed in the cross portion of said source bus line electrode and said gate bus line electrode, a pixel electrode of a transparent conductive layer connected to the drain or source of said thin film transistor, and an insulating substrate, said method comprising: a first process of piling up the transparent conductive lyaer on the insulating substrate and the first conductive layer on said transparent conductive layer to form multi-layer film; a second process of selectively removing said multi-layer film using a first mask to simultaneously separate and form the pattern of said gate bus line electrode and the pixel electrode; a third process of selectively form in said thin film transistor, made of an insulating layer and a semiconductive layer, on said gate electrode.

2. A method for production of a thin film transistor array in accordance with claim 1, further comprising a fourth process of removing at least one portion of the first conductive layer on the pattern of the pixel electrode after said first process.

3. A method for producing of a thin film transistor array in accordance with claim 1, further comprising: in said third process for forming the thin film transistor, a fifth process of piling up the insulating layer and the semiconductive layer; a sixth process of selectively removing said insulating layer and semicondcutive layer using a second mask to remove at least said semiconductive layer and said insulating layer on said pixel electrode with said semiconductive layer and said insulating layer remaining of the crossing portion of at least the gate bus line electrode and the source bus line electrode, and of the portion of forming said thin film transistor; a seventh process of piling up the second conductive layer; and an eighth process of forming the source drain and source bus line electrode by the second conductive layer using a third mask.

4. A method for production of a thin film transistor array in accordance with claim 3, further comprising: in said third process, a ninth process for piling up an insulating layer, a semiconductive layer, a channel protective layer; a tenth process having said channel protective layer remaining on the channel portion of at least the thin film transistor using a fourth mask, said sixth process, said seventh process, an eleventh process of forming the source drain and source bus line electrode by the second conductive layer using said third mask to remove the semiconductor except for portions thereof disposed under the second conductive layer and the channel protective layer.

5. A method form production of a thin film transistor array in accordance with claim 1, wherein the insulating layer of said thin film transistor is composed of multi-layer film, and the first insulating layer in contact with the gate electrode is oxide, and the second insulating layer in contact with the semiconductive layer is silicon nitride, and said semiconductive layer is hydrogenerated amorphous silicon.

* * * * *